(12) United States Patent
Yoon et al.

(10) Patent No.: US 10,304,698 B2
(45) Date of Patent: May 28, 2019

(54) SYSTEM AND METHOD FOR LASER ASSISTED BONDING OF SEMICONDUCTOR DIE

(71) Applicant: Amkor Technology, Inc., Tempe, AZ (US)

(72) Inventors: Tae Ho Yoon, Daejeon (KR); Yang Gyoo Jung, Seoul (KR); Min Ho Kim, Seoul (KR); Youn Seok Song, Gwangju (KR); Dong Soo Ryu, Seongnam-si (KR); Choong Hoe Kim, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/919,569

(22) Filed: Mar. 13, 2018

(65) Prior Publication Data

US 2018/0204740 A1    Jul. 19, 2018

Related U.S. Application Data

(63) Continuation of application No. 15/130,637, filed on Apr. 15, 2016, now Pat. No. 9,916,989.

(51) Int. Cl.
| | |
|---|---|
| *G02B 27/09* | (2006.01) |
| *H01L 21/48* | (2006.01) |
| *H01L 21/60* | (2006.01) |
| *H01L 23/00* | (2006.01) |
| *H01L 23/31* | (2006.01) |
| *H01L 25/00* | (2006.01) |
| *H01L 25/065* | (2006.01) |

(52) U.S. Cl.
CPC ...... *H01L 21/4853* (2013.01); *G02B 27/0927* (2013.01); *H01L 24/75* (2013.01); *H01L 24/81* (2013.01); *H01L 23/3128* (2013.01); *H01L 25/0657* (2013.01); *H01L 25/50* (2013.01); *H01L 2021/60112* (2013.01); *H01L 2224/131* (2013.01); *H01L 2224/16145* (2013.01); *H01L 2224/16227* (2013.01); *H01L 2224/73204* (2013.01); *H01L 2224/75263* (2013.01); *H01L 2224/81002* (2013.01); *H01L 2224/81007* (2013.01); *H01L 2224/81191* (2013.01); *H01L 2224/81224* (2013.01); *H01L 2224/81815* (2013.01); *H01L 2224/92125* (2013.01); *H01L 2225/06513* (2013.01); *H01L 2924/15311* (2013.01); *H01L 2924/18161* (2013.01); *H01L 2924/3511* (2013.01)

(58) Field of Classification Search
None
See application file for complete search history.

(56) References Cited

U.S. PATENT DOCUMENTS 8,318,536 B2   11/2012  Li
9,916,989 B2    3/2018  Yoon et al.
(Continued)

*Primary Examiner* — Thien F Tran
(74) *Attorney, Agent, or Firm* — McAndrews, Held & Malloy, Ltd.

(57) ABSTRACT

A system and method for laser assisted bonding of semiconductor die. As non-limiting examples, various aspects of this disclosure provide systems and methods that enhance or control laser irradiation of a semiconductor die, for example spatially and/or temporally, to improve bonding of the semiconductor die to a substrate.

23 Claims, 12 Drawing Sheets

(56) References Cited

U.S. PATENT DOCUMENTS

| | | |
|---|---|---|
| 2009/0170239 A1 | 7/2009 | Li |
| 2012/0104383 A1* | 5/2012 | Lai ........................ C23C 14/086 257/43 |
| 2015/0294951 A1 | 10/2015 | Smits |
| 2017/0301560 A1 | 10/2017 | Yoon et al. |

* cited by examiner

SYSTEM AND METHOD FOR LASER ASSISTED BONDING OF SEMICONDUCTOR DIE

CROSS-REFERENCE TO RELATED APPLICATIONS/INCORPORATION BY REFERENCE

This application is a continuation of U.S. patent application Ser. No. 15/130,637, filed Apr. 15, 2016, expected to issue as U.S. Pat. No. 9,916,989 on Mar. 13, 2018 and titled "SYSTEM AND METHOD FOR LASER ASSISTED BONDING OF SEMICONDUCTOR DIE," the entire contents of which is hereby incorporated herein by reference, in its entirety.

BACKGROUND

Present systems and methods for laser bonding semiconductor die to a substrate are inadequate, for example potentially resulting in connection or device failures. Further limitations and disadvantages of conventional and traditional approaches will become apparent to one of skill in the art, through comparison of such approaches with the present disclosure as set forth in the remainder of the present application with reference to the drawings.

SUMMARY

Figure 1A:
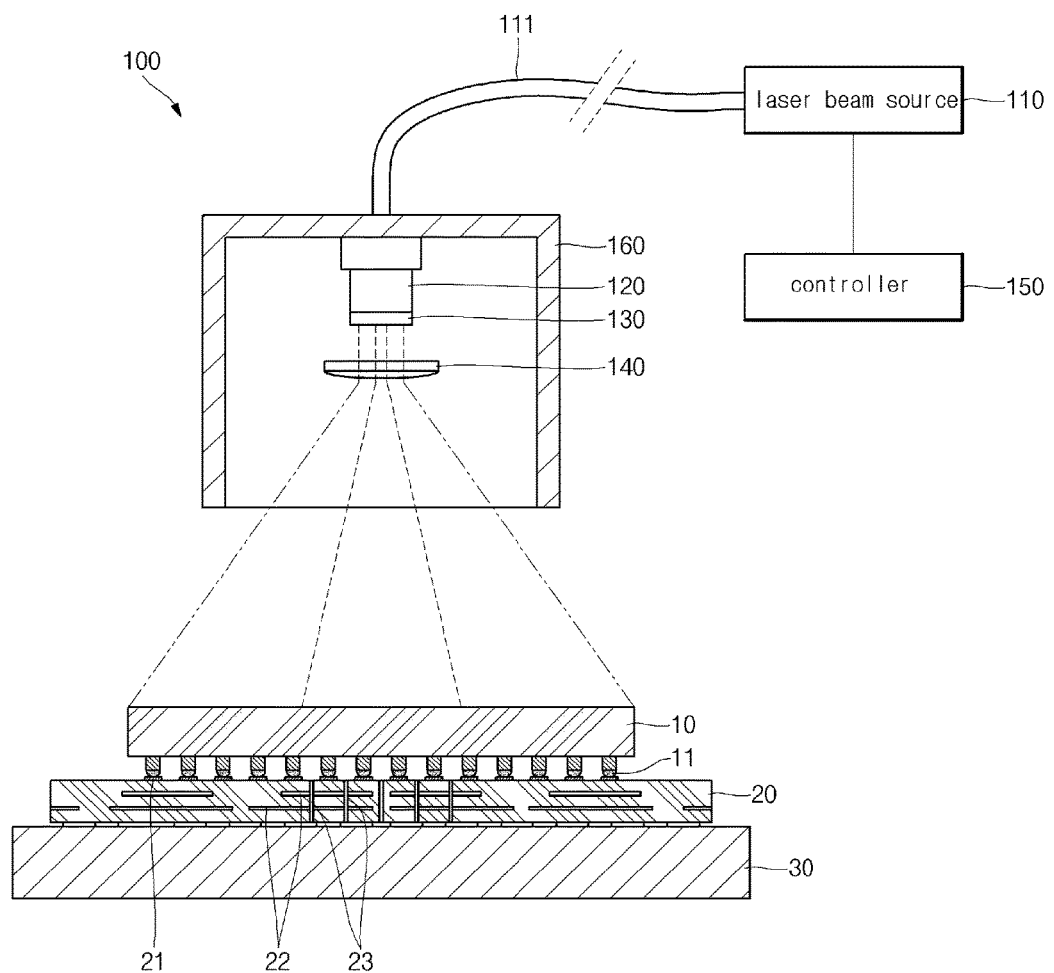
FIG. 1A shows a schematic view of an example laser assisted bonding system and method, and an example semiconductor device, in accordance with various aspects of the present disclosure.

Various aspects of this disclosure provide a system and method for laser assisted bonding of semiconductor die. As non-limiting examples, various aspects of this disclosure provide systems and methods that enhance or control laser irradiation of a semiconductor die, for example spatially and/or temporally, to improve bonding of the semiconductor die to a substrate.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Note that in general, same reference numerals will be utilized herein to represent same and/or similar components.

As discussed herein, a controller and/or another related device or element according to the present disclosure (e.g., a device controlled by a controller, a device providing direction or information to a controller, etc.) may be implemented exclusively in hardware, in a combination of hardware and software (or firmware), etc. For example, various components of the controller and/or another related device or element may be formed on one integrated circuit chip or a plurality of integrated circuit chips (e.g., discrete chips of a multi-chip module, discrete chips on a motherboard, discrete chips of discrete components of a distributed system, etc.). Also, various components of the controller and/or other related device may be implemented on a flexible printed circuit film, and may be formed on a tape carrier package, a printed circuit board, or the same substrate as the controller and/or other related device. Also, various components of the controller and/or related device may constitute a process or thread executed by one or more processors in one or more computing devices, and the process or thread may execute computer program commands and interact with other components so as to perform various functions described herein. The computer program commands may be stored in, for example, a memory and may be executed in a computing device. The computer program commands may be stored in, for example, a random access memory and/or any of a variety of types of non-transitory computer-readable media such as hard drives, ROMs, PROMs, CDs, DVDs, USB drives, flash memory devices, etc. It should be understood that various functions of computing devices may implemented by one computing device, or may be distributed among a plurality computing devices without departing from the scope of the present disclosure.

In an example implementation, in accordance with various aspects of the present disclosure, the controller (or a portion thereof) may be implemented in a general-purpose computer including a central processing unit, a large-capacity storage device such as a hard disk or a solid state disk, a volatile memory device, an input device such as a keyboard or a mouse, and an output device such as a monitor or a printer.

Various aspects of the present disclosure provide a laser assisted bonding system (or device), a method of performing laser assisted bonding, and/or a semiconductor device manufactured utilizing such a system or method. In an example implementation, a semiconductor die may be uniformly (or equally) heated by one or more laser beams, for example irradiating different regions of the semiconductor die with different respective laser beam intensity. Also, a spot size of one or more laser beams may be increased or decreased in real time, for example between a central region and a peripheral region of the semiconductor die. Additionally, a laser beam absorbing layer may be formed on the semiconductor die to enhance the absorption of laser energy by the semiconductor die. Accordingly, various aspects of this disclosure provide for manufacturing a semiconductor device with less die tipping and/or warping, resulting in higher device quality and reliability, increased manufacturability, lower cost, etc.

The above and other aspects of the present disclosure will be described in or be apparent from the following description of various example implementations. Various aspects of the present disclosure will now be presented with reference to accompanying drawings.

Figure 1B:
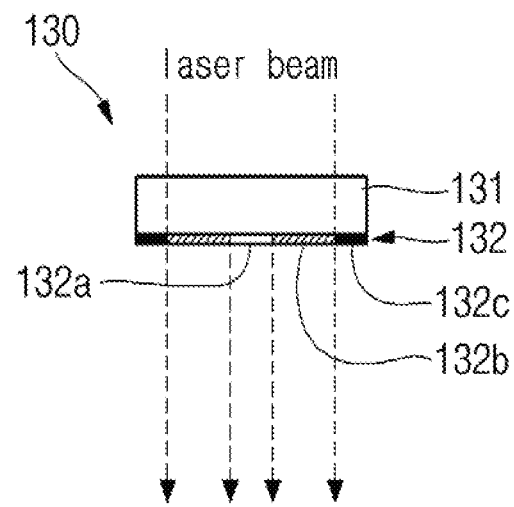
FIG. 1B shows a side view of an example beam filter, in accordance with various aspects of the present disclosure.
Figure 1C:
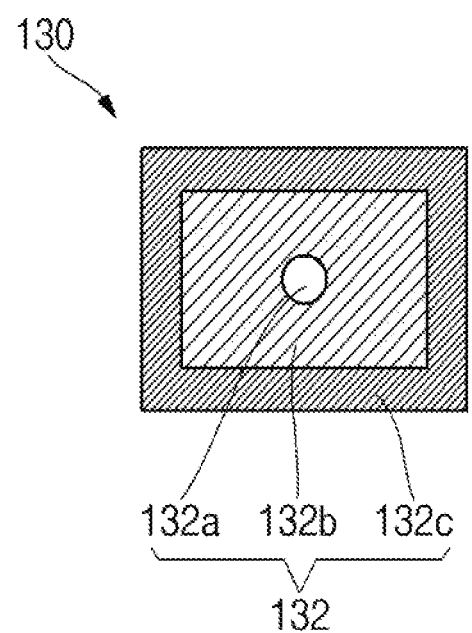
FIG. 1C shows a plan view of an example beam filter, in accordance with various aspects of the present disclosure.

FIG. 1A shows a schematic view of an example laser assisted bonding system 100 and an example semiconductor device, in accordance with various aspects of the present disclosure. FIG. 1B shows a side view of an example beam filter 130, in accordance with various aspects of the present disclosure. FIG. 1C shows a plan view of an example beam filter 130, in accordance with various aspects of the present disclosure. The following discussion will now discuss FIGS. 1A-1C together. Note that the laser assisted bonding system 100 and/or the utilization thereof may, for example, share any or all characteristics with any other laser assisted bonding system and/or the utilization thereof discussed herein (e.g., the laser assisted bonding system 200 of FIGS. 2A-2B, the laser assisted bonding system 300 of FIGS. 3A-3C, a laser assisted bonding system implementing the methods provided herein, etc.).

The example laser assisted bonding system 100 (or device) includes a laser beam source 110, a beam homogenizer 120, and a beam filter 130. The example laser assisted bonding system 100 may also, for example, include a diffusion lens 140. Moreover, the example laser assisted bonding system 100 may further include a controller 150.

The example laser beam source 110 may comprise any of a variety of characteristics, non-limiting examples of which are provided herein. For example, the laser beam source 110 may be (or include) a single mode laser diode or a diode pumped solid state laser, which generates infrared laser beams having a wavelength of about 780 nm to 1000 nm (e.g., 980 ng). Also for example, the laser beam source 110 may be (or include) a diode pumped solid state laser that generates near-infrared or middle-infrared Gaussian laser beams having a wavelength of about 780 nm to 4 μm.

The example beam homogenizer 120 may comprise any of a variety of characteristics, non-limiting examples of which are provided herein. The beam homogenizer 120 may, for example, be optically coupled to the laser beam source 110. In the example system 100, the beam homogenizer 120 receives the output of the laser beam source 110 through an optical cable or fiber 111. The beam homogenizer 120 may, for example, convert a Gaussian laser beam received from the laser beam source 110 into, for example, a square flat-top laser beam, thus radiating (or transmitting or outputting or passing) the square flat-top laser beam.

In an example implementation in which a square flat-top laser beam output from the beam homogenizer 120 ultimately irradiates the semiconductor die 10, such irradiation heats the semiconductor die 10. The heating, in turn, causes conductive interconnection structures 11 (e.g., solder balls or bumps, solder-capped metal posts or pillars, etc.) interposed between the semiconductor die 10 and a substrate 20 to reflow, thus bonding the semiconductor die 10 to the substrate 20.

Returning to the example system 100 of FIG. 1A, a beam filter 130 is optically coupled to the beam homogenizer 120. The example beam filter 130 may comprise any of a variety of characteristics, non-limiting examples of which are provided herein. The example beam filter 130 may, for example, filter the laser beam (or radiation) received from the beam homogenizer 120 and output a plurality of laser beams (or beamlets or laser beam portions), each having a respective intensity. Each of the respective intensities may, for example, be different from all of the others, different from only some of the others, etc. Each of the respective laser beams (or laser beam portions) may, for example, correspond to a respective region of the semiconductor die 10 to be irradiated. Thus, each of a plurality of regions of the semiconductor die 10 may ultimately be irradiated with a respective laser beam (or laser beam portion) having a respective intensity customized to the region.

For example, if the density of heat paths in a first region (e.g., a central region, etc.) of the semiconductor die 10 is higher than the density of heat paths in a second region (e.g., a peripheral or circumferential region, etc.) of the semiconductor die 10, the beam filter 130 allows (e.g., through spatially selective filtering) laser beams (or beamlets or laser beam portions) having a relatively high intensity to irradiate the first region of the semiconductor die 10, and allows laser beams having a relatively low intensity to irradiate the second region of the semiconductor die 10. Thus, the entire semiconductor die 10 may be uniformly heated, and accordingly, tilting and/or warping of the semiconductor die 10 may be prevented or reduced. Such prevention or reduction in tilting and/or warping may, in turn, improve the reliability of the semiconductor die 10, for example improving the reliability of the mechanical and electrical connections between semiconductor die 10 and the substrate 20 (e.g., between the interconnection structures 11 and the pads 21). More examples of such operation are provided herein.

The diffusion lens 140 is optically coupled to the beam filter 130 (e.g., directly or indirectly coupled). The example diffusion lens 140 may comprise any of a variety of characteristics, non-limiting examples of which are provided herein. For example, the diffusion lens 140 may receive the laser beams (or beamlets or laser beam portions) from the beam filter 130 and increase the overall spot size of the laser beams to match the size of the top side or surface of the semiconductor die 10. Such size matching may, for example, be exact to within acceptable manufacturing tolerances, exact to within 1%, exact to within 5%, etc. Note that in an example implementation in which the spot size of the laser beam(s) (or radiation) output from the beam filter 130 is already sufficiently large, the diffusion lens 140 may be omitted. Also note that in scenarios in which a peripheral portion of the semiconductor die 10 is not to be irradiated, the diffusion lens 140 might only increase the overall spot size cover the portion of the die 10 to be irradiated.

The beam homogenizer 120, the beam filter 130, the diffusion lens 140, and for example an attachment to the optical cable 111 may be installed in a protective case 160 (e.g., having an open bottom, or an aperture in a bottom side, through which laser energy may freely pass).

The example controller 150 generally controls the laser beam source 110, for example turning the laser on and off, controlling the pulse width and/or frequency, controlling the total output power, etc. The controller 150, as described above, may be implemented by hardware, a combination of hardware and/or software, etc.

In an example laser bonding scenario, the semiconductor die 10 is positioned (or mounted) on the substrate 20. The semiconductor die 10 may comprise any of a variety of characteristics, non-limiting examples of which are provided herein. For example, the semiconductor die 10 may, comprise a functional die (e.g., a processor die, memory die, programmable logic die, application specific integrated circuit die, general logic die, etc.). Also for example, the semiconductor die 10 may comprise a semiconductor die comprising only signal routing structures (e.g., one or more dielectric layers and one or more conductive layers for distribution or redistributing electrical signals). Note that although this disclosure generally presents item 10 as a semiconductor die, the scope of this disclosure is not limited thereto. For example, item 10 may comprise any of a variety of other structures (e.g., a semiconductor layer, a dielectric layer, a glass layer, a laminate layer, a molding material layer, an interposer layer, a printed circuit board layer, any combination thereof, etc.) without departing from the scope of this disclosure The substrate 20 may comprise any of a variety of characteristics, non-limiting example of which are provided herein. For example, the substrate 20 may comprise an interposer, an interposer die, a wafer of interposer dies, a circuit board, a panel of circuit boards, another semiconductor die or wafer thereof, a packaged semiconductor device or portion thereof, etc.). The substrate 20 may, in turn, be fixed on a carrier (e.g., secured to a vacuum chuck 30, clipped or adhered to a plate, etc.).

The semiconductor die 10 includes a plurality of interconnection structures 11 on the bottom surface thereof, and the substrate 20 includes a plurality of conductive pads 21 on the top surface thereof. An interconnection structure 11 may comprise any of a variety of types of interconnection structures (e.g., a solder bump or ball, a metal post or pillar having a solder cap, etc.). Each of the interconnection structures 11 may, for example, be aligned with a respective conductive pad 21 of the substrate 20. In addition, a solder paste and/or a flux may be further formed on the conductive pads 21 and/or on the interconnection structures 11 (e.g., by printing, injecting, dipping, spraying, etc.).

The example substrate 20 includes a plurality of wiring patterns and/or a plurality of conductive vias 23, which operate as heat paths. For example, when the number or width of wiring patterns 22 and/or conductive vias 23 in one region of the substrate 20 is greater or wider than that of wiring patterns 22 and/or conductive vias 23 in another region, the density of heat paths in the one region is relatively higher than in the other region. Moreover, the interconnection structures 11 formed on the semiconductor die 10 may also operate as heat paths. Thus, when the number of interconnection structures 11 of the semiconductor die 10 in one region is greater than the number of interconnection structures 11 in another region, the density of heat paths in the one region is relatively higher than in the other region.

If the density of wiring patterns 22 and/or conductive vias 23 in one region of the substrate 20 is high, heat of a region of the semiconductor die 10 corresponding to the one region of the substrate 20 is rapidly discharged. Also, if the density of interconnection structures 11 in one region of the semiconductor die 10 is high, heat in the one region is rapidly discharged.

Therefore, if a top surface of the semiconductor die 10 is uniformly irradiated by one or more laser beams (e.g., at a uniform laser intensity), the temperature of a region having a relatively high density of heat paths will be relatively low, and the temperature of a region having a relatively low density of heat paths will be relatively high. As a result, the semiconductor die 10 will be unevenly heated, and therefore, the interconnection structures 11 (or reflowable material associated therewith) will be unevenly reflowed. For example, while the interconnection structures 11 in one region are sufficiently melted, the interconnection structures 11 in another region might not be sufficiently melted. Accordingly, the semiconductor die 10 may be tilted in the horizontal or vertical direction, and/or the semiconductor die 10 may be warped, due to the uneven reflow of the interconnection structures 11.

In accordance with various aspects of this disclosure, however, the beam filter 130 allows laser beams (or beamlets or laser beam portions) having a relatively high intensity to irradiate a region in which the density of heat paths of the semiconductor die 10 and/or the substrate 20 is relatively high, and allows laser beams having a relatively low intensity to irradiate a region in which the density of heat paths of the semiconductor die 10 and/or the substrate 20 is relatively low, so that the entire irradiated area of the semiconductor die 10 may be evenly heated. Accordingly, the above-described tilt and/or warpage of the semiconductor die 10 may be prevented or reduced.

As shown in FIGS. 1B and 1C, the beam filter 130 may include a base material 131 (e.g., crystal, glass, etc.) having a planar or approximately planar top surface and a planar or approximately planar bottom surface, and a filtering pattern 132 coated on the base material 131 (e.g., coated on at least one of the planar surfaces of the base material 131). The base material 131 may, for example, allow laser beams to be transmitted therethrough (e.g., with a generally high and uniform transmittance), and the filtering pattern 132 may, for example, allow laser beams having different intensities for every region of the semiconductor die 10 to be transmitted therethrough. The planar shape of the beam filter 130 may be an approximately square or quadrangular shape (e.g., identical or similar to the shape of the semiconductor die 10), but the scope of the present disclosure is not limited thereto. In addition, in another implementation, the beam filter 130 may include only the filtering pattern 132 without the base material 131.

The filtering pattern 132 may, for example, include a first filtering pattern 132a, a second filtering pattern 132b, and a third filtering pattern 132c. Though only three example filtering patterns are shown, the filtering pattern 132 may comprise any number of patterns. The first example filtering pattern 132a has a relatively low density, and hence a relatively high transmittance (e.g., at or near 100%, in a range between 90% and 100%, etc.). Therefore, the first filtering pattern 132a may allow laser beams having a relatively high intensity to pass through and be radiated (or transmitted) from the first filtering pattern 132a. The second example filtering pattern 132b has a relatively moderate density, and hence a relatively moderate transmittance (e.g., at or near 80%, in a range between 70% and 90%, etc.). Therefore, the second filtering pattern 132b may allow laser beams having a relatively moderate intensity to pass through and be radiated (or transmitted) from the second filtering pattern 132b. The third example filtering pattern 132c has a relatively high density, and hence a relatively low transmittance (e.g., at or near 60%, in a range between 40% and 60%, less than 60%, etc.). Therefore, the third filtering pattern 132c may allow laser beams having a relatively low density to pass through and be radiated from the third filtering pattern 132c.

As an example, in FIG. 1B, the first example filtering pattern 132a having a relatively low density is positioned (or formed) in an approximately central region of the beam filter 130, so that laser beams having a relatively high intensity are transmitted through the first filtering pattern 132a. The second example filtering pattern 132b having a relatively moderate density is positioned (or formed) in a peripheral region around the first filtering pattern 132a, so that laser beams having a relatively moderate intensity are transmitted through the second filtering pattern 132b. The third example filtering pattern 132c is positioned (or formed) in an outer peripheral (or circumferential) region around the second filtering pattern 132b, so that laser beams having a relatively low intensity are transmitted through the third filtering pattern 132c. Note that in various example scenario, a filtering pattern may also be generally opaque, resulting in no laser energy passing therethrough.

In an example bonding scenario, the density of heat paths in a region corresponding to the center of the semiconductor die 10 is relatively high, and the density of heat paths in a region corresponding to the periphery (or circumference) of the semiconductor die 10 is relatively low. Therefore, the shapes of the first, second, and third filtering patterns 132a, 132b, and 132c (or any number of filtering patterns) may be determined such that laser beams (or beamlets or laser beam portions) having a relatively high intensity are radiated onto the region corresponding to the center of the semiconductor die 10, and laser beams having a relatively low intensity are radiated onto the region corresponding to the periphery of the semiconductor die 10.

As discussed herein, the shapes or arrangements of the example first, second, and third filtering patterns 132a, 132b, and 132c are merely examples presented for illustrative purposes, and the scope of the present disclosure is not limited thereto. For example, instead of generally symmetric irradiation, the arrangement of various filtering patterns may provide for asymmetric irradiation of the semiconductor die 10 (e.g., in a scenario in which the heat path density of a left side of the semiconductor die 10 is different from that of a right side of the semiconductor die 10, in a scenario in which the highest heat path density for the semiconductor die 10 is at or toward a particular corner of the semiconductor die 10, etc. Also for example, the arrangement of various filtering patterns may provide for relatively high intensity irradiation of a peripheral region of the semiconductor die 10 and relatively low intensity irradiation of the central region of the semiconductor die 10 (e.g., in a scenario in which the heat path density of in the peripheral region is greater than the heat path density of the central region).

The filtering pattern 132 may be formed of any material capable of affecting the transmission of a laser beam. For example, the filtering pattern 132 may be formed by coating the base material 131 with one or two or more selected from magnesium fluoride ($MgF_2$), silicon monoxide (SiO), and equivalents thereof. However, the scope of the present disclosure is not limited to these materials.

In addition, the filtering pattern 132 may be formed by alternately coating the base material 131 with materials having different refractive indices multiple times. A coating region of the base material 131, a thickness of a coating layer, a material of a coating layer, and/or a number of coats may be controlled such that laser beams having different intensities are passed through respective regions of the beam filter 130 and ultimately radiated onto respective regions of the semiconductor die 10. Though in some of the examples discussed herein, for example for illustrative purposes, the first, second, and third filtering patterns 132a, 132b, and 132c are presented as having different respective densities, filtering pattern characteristics other than density may be utilized to control the intensity of laser beams passing through such filtering patterns. For example, the intensity of one or more laser beams transmitted through (or radiating from) the beam filter 130 (or regions thereof) may be controlled by controlling an area or thickness of a coating layer, a number layers coated, and/or a refractive index, instead of (or in addition to) the density.

In accordance with various aspects of the present disclosure, for example utilizing the example laser assisted bonding system 100, laser beams having different respective intensities are radiated onto different respective regions of the semiconductor die 10 according to densities of heat paths formed in the semiconductor die 10 and/or the substrate 20. As such, tilting and/or warpage of the semiconductor die 10 may be prevented or reduced. Additionally, the reliability of the semiconductor die 10, for example with respect to the interconnection structures 11 and/or pads 21 and/or the connections therebetween, may be improved.

To this point, utilization and operation of a single beam filter 130 has been discussed. It should be understood that a plurality of such beam filters 130 may be utilized, for example simultaneously and/or sequentially. For example, a single laser assisted bonding system may utilize a plurality of different respective beam filters 130, each corresponding to a different respective semiconductor device. Also for example, a laser assisted bonding system may utilize a plurality of different beam filters sequentially to perform laser assisted bonding of a same die (e.g., in different stages). Additionally for example, a laser assisted bonding system may utilize a plurality of same beam filters (e.g., utilizing a second same beam filter while a first same beam filter cools, utilizing a second beam filter when a potential anomaly or failure has been detected in devices bonded utilizing a first same beam filter, etc.). Accordingly, various aspects of this disclosure provide for the utilization of a selectable beam filter at any point in time and/or during any period of time.

Figure 2A:
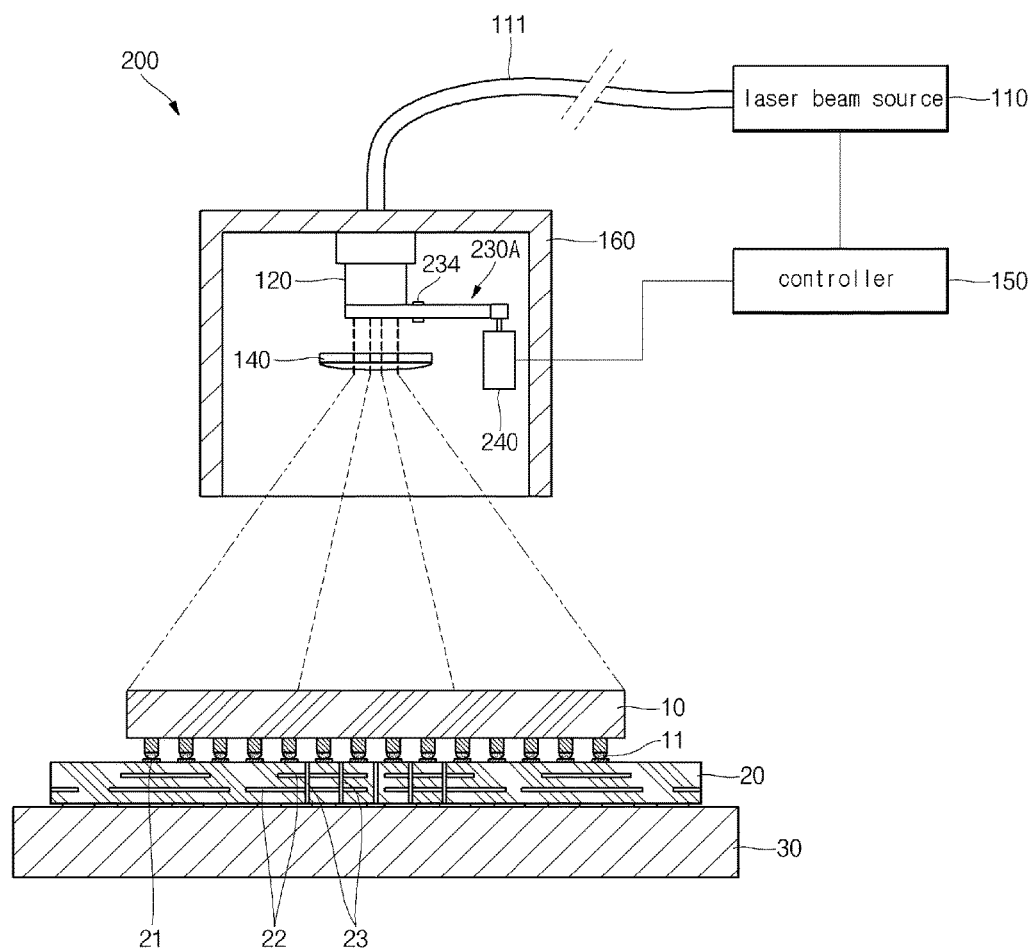
FIG. 2A shows a schematic view of an example laser assisted bonding system and method, and an example semiconductor device, in accordance with various aspects of the present disclosure.
Figure 2B:
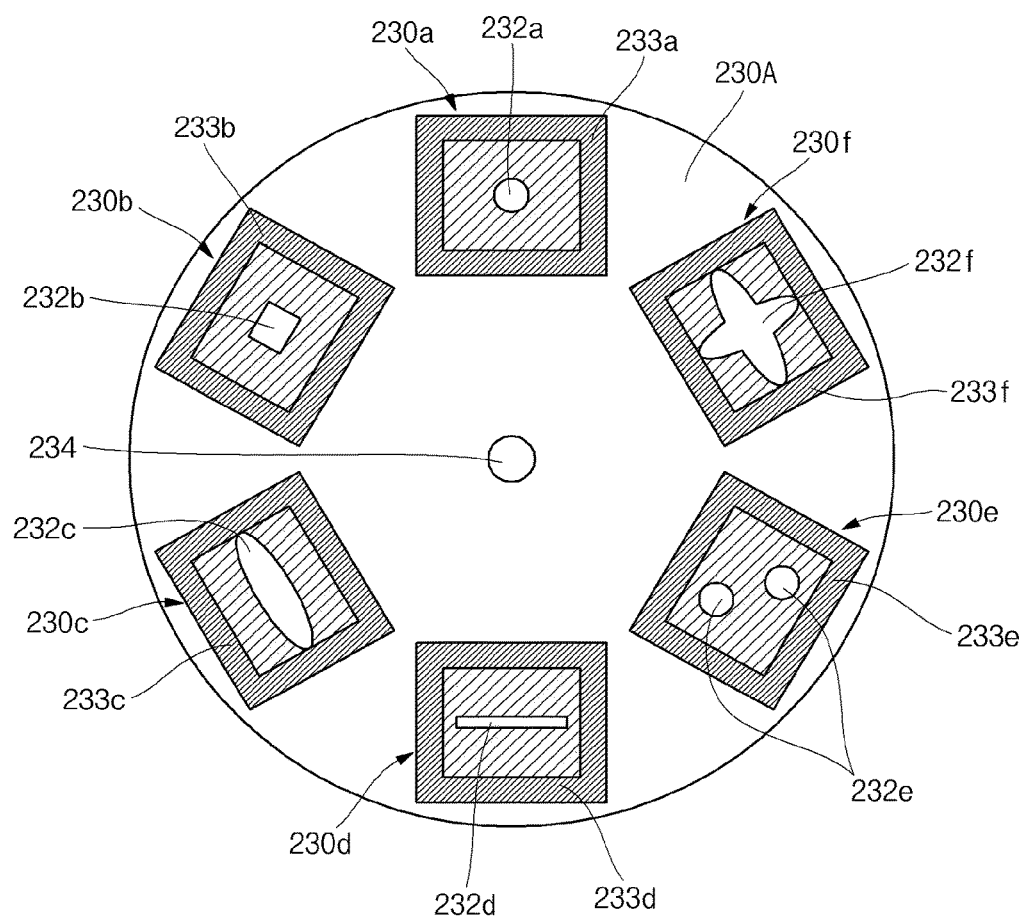
FIG. 2B shows a plan view of an example beam filter changer, in accordance with various aspects of the present disclosure.

FIG. 2A shows a schematic view of an example laser assisted bonding system 200 and an example semiconductor device, in accordance with various aspects of the present disclosure. FIG. 2B shows a plan view of an example beam filter changer 230A, in accordance with various aspects of the present disclosure. The following discussion will now discuss FIGS. 2A-2B together. Note that the laser assisted bonding system 200 and/or the utilization thereof may, for example, share any or all characteristics with any other laser assisted bonding system and/or the utilization thereof discussed herein (e.g., the laser assisted bonding system 100 of FIGS. 1A-1C, the laser assisted bonding system 300 of FIGS. 3A-3C, a laser assisted bonding system implementing the methods provided herein, etc.).

The example laser assisted bonding system 200 may, for example, include a beam filter changer 230A. The beam filter changer 230A will also be referred to herein as a rotatable circular holder 230A or holder 230A. Though the beam filter changer 230A is illustrated herein as a circular (or turn-table or rotary) changer, the scope of this disclosure is not limited thereto. In the example rotatable circular holder 230A, a plurality of beam filters 230a to 230f are positioned (or mounted) in a peripheral circular region thereof. An electric motor 240 is coupled to the holder 230A to rotate the peripheral circular region around a rotary shaft 234. The electric motor 240 may, for example, be controlled by a controller 150. The controller 150 may, for example, share any or all characteristics with any example controller provided herein.

The example beam filters 230a to 230f mounted in the holder 230A may have different filtering patterns 232a to 232f, respectively. Also for example, at least some of the beam filters 230a to 230f may have the same filtering patterns (e.g., for sequentially utilization and cooling, for failover, etc.). The example beam filters 230a to 230f may, for example, share any or all characteristics with the example beam filter 130 of FIG. 1.

Each of the filtering patterns 232a to 232f, through which laser beams having a relatively high intensity are transmitted, may have any of a variety of shapes (e.g., circular, square, elliptical, rectangular, polygonal, cross-like shape, etc.). Also, each of the filtering patterns 233a to 233f, through which laser beams having a relatively low intensity are transmitted, may be positioned around the peripheries of the respective filtering patterns 232a to 232f. In the example shown, the filtering patterns 232a to 232f, or any portions thereof, may be separated from the filtering patterns 233a to 233f by other filtering patterns having a relatively moderate transmittance. Referring to example beam filter 230e, a plurality of the filtering patterns 232e, through which laser beams having a relatively high intensity are transmitted, may be provided, and the plurality of filtering patterns 232e may be spaced apart from each other at a predetermined distance. It should be understood that the shapes of the example filtering patterns are merely illustrative examples, and thus the scope of this disclosure is not limited thereto. For example, the mapping of any filtering pattern may be configured to match (or inversely match) a corresponding mapping of heat path density for a semiconductor device assembly (e.g., of a semiconductor die, of a substrate, of the combined semiconductor die and substrate, etc.). Note that such mapping may, for example, be scaled.

In general, the density of heat paths formed in a semiconductor die 10 and/or a substrate 20 may vary depending on the kind, shape, design and/or usage of a semiconductor device. Thus, in a manufacturing scenario in which a single laser assisted bonding system is utilized to bond different die/substrate combinations, if beam filters are manually replaced whenever a different semiconductor device is bonded, processing time will be increased by the time required to manually replace the beam filter.

However, as described above, the holder 230A may be rotated about a rotary shaft 234, and accordingly, a desired beam filter 230a to 230f may be efficiently rotated into position, for example in relation to the beam homogenizer 120, thereby reducing the changeover time of the beam filters 230a to 230f. Note that such beam filter changing may be performed under manual control (e.g., by an operator indicating a desired beam filter via a user interface, by an operator manually rotating in the desired filter, etc.), but may also be performed entirely automatically (e.g., without direct operator intervention). For example, the controller 150 may operate to identify the appropriate beam filter (e.g., based on a signal received from a manufacturing system controller, based on part recognition, based on workpiece bar code or QR code, etc.) and then generate the appropriate control signal to cause the holder 230A to rotate the desired beam filter into position.

In the examples provided in FIGS. 1-2, the laser intensity is generally varied spatially, for example irradiating different regions of the die 10 (or target in general) with different respective laser intensities. Also, as mentioned herein, different filters (or no filter) may be used sequentially for a single die, thus adding a temporal variability to the laser intensity for one or more regions. Another example of irradiating the semiconductor die with spatially and/or temporally varying laser energy is provided at FIGS. 3A-3C and 4.

Figure 3A:
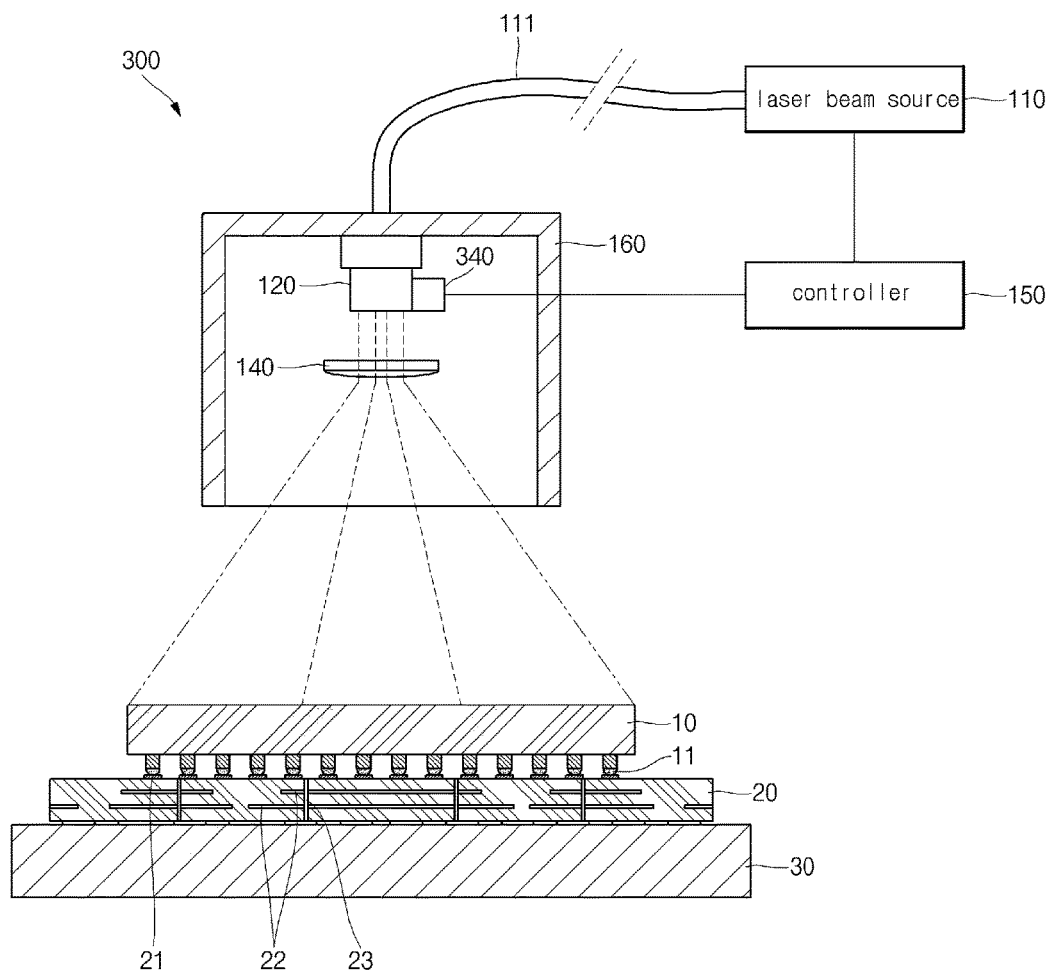
FIG. 3A shows a schematic view of an example laser assisted bonding system and method, and an example semiconductor device, in accordance with various aspects of the present disclosure.
Figure 3B:
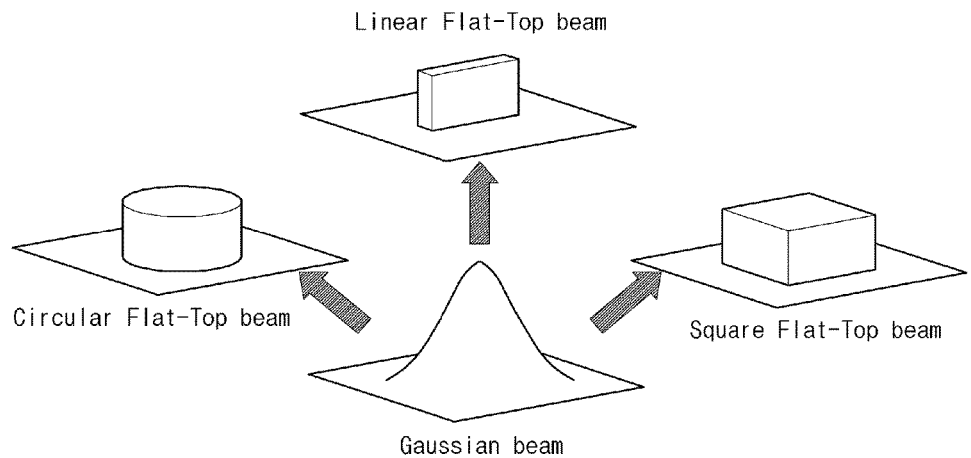
FIG. 3B illustrates conversion of a Gaussian laser beam to a variety of example flat-top beams.
Figure 3C:
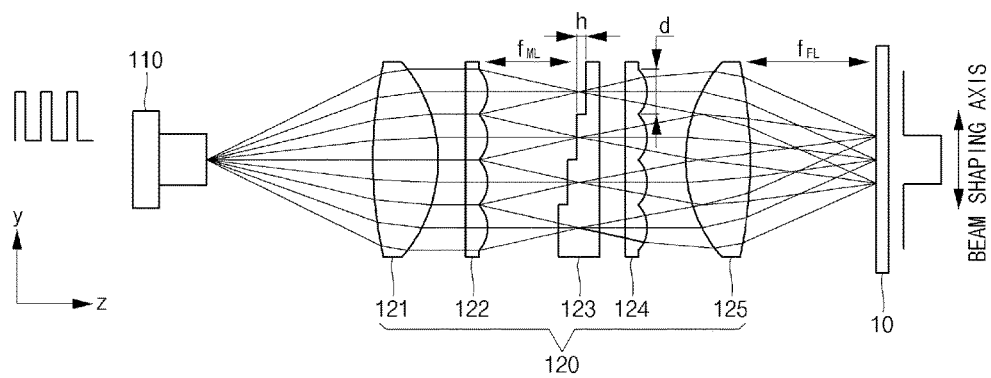
FIG. 3C shows a schematic view of an example beam homogenizer, in accordance with various aspects of the present disclosure.

FIG. 3A shows a schematic view of an example laser assisted bonding system 300 and an example semiconductor device, in accordance with various aspects of the present disclosure. FIG. 3B illustrates conversion of a Gaussian laser beam to a variety of example flat-top beams, such as may be performed by a beam homogenizer. FIG. 3C shows a schematic view of an example beam homogenizer, in accordance with various aspects of the present disclosure. The following discussion will now discuss FIGS. 3A-3C together. Note that the laser assisted bonding system 300 and/or the utilization thereof may, for example, share any or all characteristics with any other laser assisted bonding system and/or the utilization thereof discussed herein (e.g., the laser assisted bonding system 100 of FIGS. 1A-1C, the laser assisted bonding system 200 of FIGS. 2A-2B, a laser assisted bonding system implementing the methods provided herein, etc.).

The example laser assisted bonding system 300 may, for example, include a spot size changer 340 for changing a spot size of laser beams radiated by (or transmitted by, or output from) the beam homogenizer 120. The spot size changer 340 may, for example, be integrated into the beam homogenizer 120. The spot size changer 340 may, for example, be controlled by a controller 150. The controller 150 may, for example, share any or all characteristics with any example controller provided herein.

Accordingly, the laser assisted bonding system 300 may provide for varying the spot size of one or more laser beams (e.g., flat-top laser beams, a set of flat top laser beams or beamlets, etc.) in real time during a bonding process of a semiconductor die 10. As an example, the beam homogenizer 120 may control the spot size of the laser beam(s) to be relatively small at an early stage of the bonding process, may control the spot size of the laser beam(s) to be relatively large at a middle stage of the bonding process, and may control the spot size of the laser beam(s) to again be relatively small at a final stage of the bonding process. For example, the starting and ending laser beam spot size may be the same, but need not be.

In an example implementation, the laser assisted bonding system 300 may control the spot size of one or more square flat-top laser beams (or beamlets or laser beam portions) to be changed in real time during a bonding process of a semiconductor die 10. For example, the beam homogenizer 120 (with spot size changer 340) may control the spot size of one or more square flat-top laser beams to be relatively small at an early stage of the bonding process, may control the spot size of the one or more square flat-top laser beams to be relatively large at a middle stage of the bonding process, and may control the spot size of one or more square flat-top laser beams to again be relatively small at a final stage of the bonding process.

The example laser assisted bonding system 300 may thus effectively prevent or reduce warpage of the semiconductor die 10, particularly when the semiconductor die 10 is thin (e.g., a few hundreds of μm or less).

In general, when laser beams are radiated onto the entire region of the semiconductor die 10 (e.g., an entire top surface thereof) and the semiconductor die 10 is thin, a smile-shaped (or U-shaped) warpage of the semiconductor die 10 may occur. For example, when temperatures of the semiconductor die 10 curved in a smile shape are measured during a laser assisted bonding process, the temperature of a central region of the semiconductor die 10 may be about 300° C., and on the other hand, the temperature of a peripheral region of the semiconductor die 10 may be about 600° C. Therefore, after the bonding process is completed, the height of interconnection structures 11 formed at the center of the semiconductor die 10 may be different from that of interconnection structures 11 formed at the periphery (or circumference) of the semiconductor die 10. If the amount of warpage (or tilting in other scenarios) is high enough, one or more of the interconnection structures 11 may fail to properly connect the semiconductor die 10 to the substrate 20.

However, as described above, in the laser assisted bonding system 300, the beam homogenizer 120 capable of adjusting the spot size of laser beams may be utilized to irradiate only the central region of the semiconductor die 10 at an early stage of the bonding process, irradiate the entire region (e.g., the entire top surface) of the semiconductor die 10 at a middle stage of the bonding process, and again irradiate only the central region of the semiconductor die 10 at a final stage of the bonding process. Such operation may, for example, prevent or reduce warpage of the semiconductor die 10.

Note that the intensities of the laser beams per unit area may be equal or different for each stage. For example, as the spot size changes, the total laser energy may be inversely changed to maintain a constant beam intensity. Alternatively for example, as the spot size changes, the total laser energy may be maintained at a constant level, resulting in increased energy density as the spot size decreases and decreased energy density as the spot size increases.

As shown in FIG. 3B, a laser beam output from a laser beam source, such as the example laser beam source 110 herein, may have the form of a Gaussian beam. However, in accordance with various aspects of the present disclosure, a flat-top beam (e.g., a square flat-top beam, rectangular flat-top beam, circular flat-top beam, linear flat-top beam, etc.) may be utilized instead of the Gaussian beam. In various examples provided herein, a square (or quadrangular) flat-top beam may ultimately be used to heat a square (or quadrangular) semiconductor die 10. In such examples, the beam homogenizer 120 may operate to convert Gaussian beams into square (or quadrangular) flat-top beams. Note that although the beam homogenizer 120 is shown separate from the laser beam source 110, in another example implementation the beam homogenizer 120 may be integrated into the laser beam source.

An example beam homogenizer 130 is shown at FIG. 3C. The example beam homogenizer 120 includes a collimator 121, a first fly's eye lens 122 (or lens array), and a field lens 125. The example beam homogenizer 120 may also include a staircase element 123 positioned between the first fly's eye lens 122 and the field lens 125. The beam homogenizer 120 may further include a second fly's eye lens 124 disposed between the first fly's eye lens 122 and/or the staircase element 123, and the field lens 125.

The example collimator 121 receives a laser beam from the laser beam source 130, and converts the received laser beam into a collimated beam (e.g., a beam with no or low divergence), generally comprising parallel rays. The collimated beam from the collimator 121 is then radiated onto the first fly's eye lens 122. The collimator 121 may, for example, have sufficiently corrected spherical aberration and chromatic aberration, and radiates a collimated beam (e.g., a beam with low divergence, or having a very long focal distance) onto the first fly's eye lens 122.

The example first fly's eye lens 122 receives the collimated beam from the collimator 121, and converts the received collimated beam into square flat-top laser beams (or beamlets or beam portions) that are then radiated onto the staircase element 123. For example, the first fly's eye lens 122 may comprise an array of microlenses, which split the collimated beam received from the collimator 121 into a number of laser beams or beamlets equal to the number of microlenses. The output of the first fly's eye lens 122 is then radiated onto the staircase element 123. In an example implementation, all of the microlenses of the first fly's eye lens 122 may have the same focal distance $f_{ML}$.

The example staircase element 123 receives the laser beams from the first fly's eye lens 122 and generates differences between optical paths of the square flat-top laser beams (or beamlets), and radiates the square flat-top laser beams having the generated differences onto the second fly's eye lens 124. The staircase element 123 has the same number of steps as the number of microlenses of the first fly's eye lens 122, and may have the same aperture size d as each of the microlenses. Also, each step of the staircase element 123 has a predetermined height (e.g., a height h relative to a previous step) in the z-direction. If the steps of the staircase element 123 have different heights, the differences between the optical paths, generated by the staircase element 123, are set such that a plurality of beams (or beamlets or beam portions) do not interference with each other. This results in a smoothed diffraction pattern determined by an aperture of the microlenses, where the intensity of laser beams radiated onto the semiconductor die 10 relies upon a degree of coherence reduction.

The example second fly's eye lens 124 performs the same function as the first fly's eye lens 122, but allows the square flat-top laser beams (or beamlets or beam portions) having the differences between the optical paths, as generated by the staircase element 123, to be incident onto the field lens 125. For example, the second fly's eye lens 124 allows the square flat-top laser beams, despeckled by high temporal and spatial coherence of the staircase element 123, to be radiated onto the field lens 125.

The example field lens 125 has a predetermined focal distance $f_{FL}$, and superimposes, on the semiconductor die 10, the square flat-top laser beams (or beamlets or beam portions) having the high temporal and spatial coherence, incident from the second fly's eye lens 124 as described above. For example, the field lens 135 radiates the square flat-top laser beams having a smoothed diffraction pattern onto the semiconductor die 10.

The configuration and operation of the example beam homogenizer 120, as presented herein, are merely examples for understanding various aspects of the present disclosure, and it will be understood by those skilled in the art that any of a variety of configurations and operations may be applied.

In the example beam homogenizer 120, the position of each lens, and thus the distances between lenses and/or other elements, may be changed (e.g., by electromechanical actuation) by the spot size changer 340. For example, the spot size changer 340 may adjust the position of any one or more of the plurality of lenses constituting the beam homogenizer 120 in response to a control signal of the controller 150, so that the spot size of the laser beam(s) irradiating the semiconductor die 10 may be adjusted. As an example, the distance between the first and second fly's eye lenses 122 and 124 may be changed in real time by the spot size changer 340 to change the spot size of the laser beam(s) irradiating the semiconductor die 10. As another example, the distance between the beam homogenizer 120 and the semiconductor die 10 may be changed in real time by the spot size changer 340 to change the spot size of the laser beams irradiating the semiconductor die 10.

The spot size changer 340 may, for example, comprise any of a variety of characteristics. For example, the spot size changer 340 may be or comprise a piezoelectric element, lead screw, electric motor, etc., that can adjust the distance between lenses, or may be or comprise an electric motor that can adjust the distance between the beam homogenizer 120 and the semiconductor die 10. However, the scope of the present disclosure is not limited thereto. For example, the spot size changer 340 may be achieved by any of a variety of mechanical and/or electrical structures.

Figure 4:
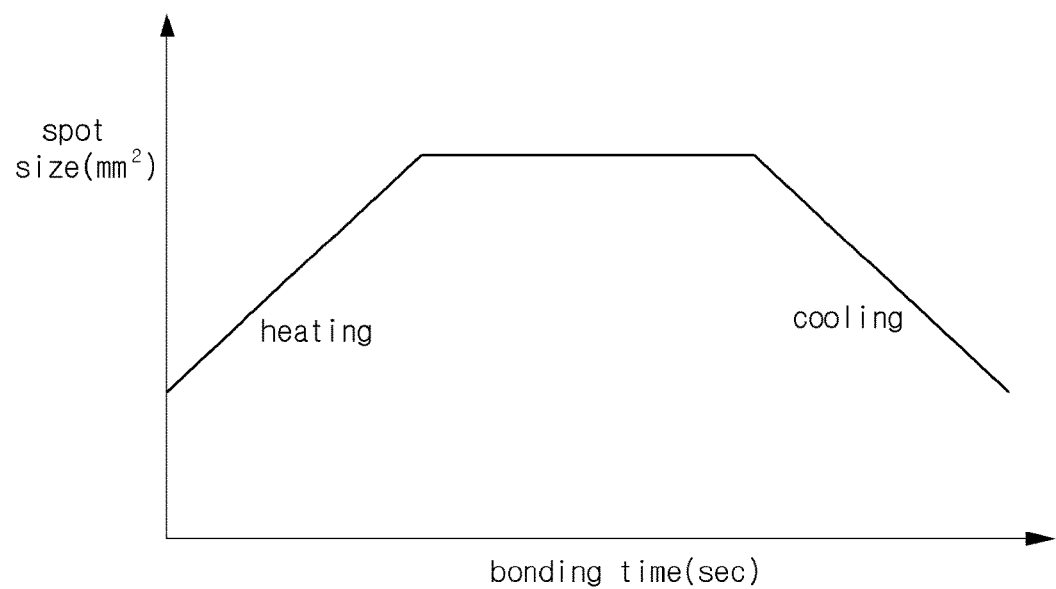
FIG. 4 shows a graph of an example laser assisted bonding profile including varying spot size versus bonding time, in accordance with various aspects of the present disclosure.

FIG. 4 shows a graph of an example laser assisted bonding profile including varying spot size versus bonding time, in accordance with various aspects of the present disclosure. The example laser assisted bonding system 300 or any example system provided herein may, for example, operate in accordance with the example bonding profile.

Referring to FIG. 4, a graph of an example laser assisted bonding profile including varying laser beam spot size versus bonding time is shown. For example, the horizontal axis generally shows bonding time, and the vertical axis generally shows laser beam spot size. The spot size may, for example, coincide with the area of the semiconductor die 10 being irradiated by the laser beam(s).

As shown in FIG. 4, laser beam spot size (e.g., at the surface of the semiconductor die 10) may be changed by the beam homogenizer 120 and the spot size changer 340 as bonding time elapses. In the example scenario illustrated in FIG. 4, during a first (or initial) stage, the laser beam spot size may be gradually increased (e.g., from an initial spot size covering only a central region of the semiconductor die 10, covering a central half of the area of the semiconductor die, etc.). Such an increase may be linear (e.g., a linear function of time, etc.) or non-linear. During a second (or middle) stage, the spot size may be maintained at a constant size (e.g. a spot size covering the entire top side of the semiconductor die, covering an area 1.5 times the area of the die, etc.). During a third (or final) stage, the spot size may be gradually decreased (e.g., from the spot size covering the entire top side of the semiconductor die). Such a decrease may be linear (e.g., a linear function of time, etc.) or non-linear. Note that the rate of spot size increase in the first stage may have the same magnitude as the rate of spot size decrease in the third stage, but such rates are not necessary. Note that the rate of increase or decrease may generally be controlled by the spot size changer 340 (or controller 150), for example as opposed to a natural response to a commanded step change in spot size, which may also be included in various implementations.

In accordance with various aspects of the present disclosure, the heating temperature of the interconnection structure 11 is gradually increased, and the cooling temperature of the interconnection structure 11 is gradually decreased, so that the quality and reliability of the semiconductor die 10 with respect to the interconnection structure 11 is enhanced.

In another example scenario, the spot size of the laser beam(s) may be gradually increased from an early stage to a final stage of the bonding process, and the bonding process may finish at the final stage (e.g., at which time the laser source 110 may be turned off or otherwise interrupted). In another example, the spot size of the laser beam(s) may be gradually increased from an early stage to a middle stage of the bonding process, may be constantly maintained at the middle stage of the bonding process, and the bonding process may finish at the middle stage. In addition, the spot size of the laser beam may be varied in real time depending on the thickness, size, shape, and/or characteristics of the semiconductor die 10.

Figure 5A:
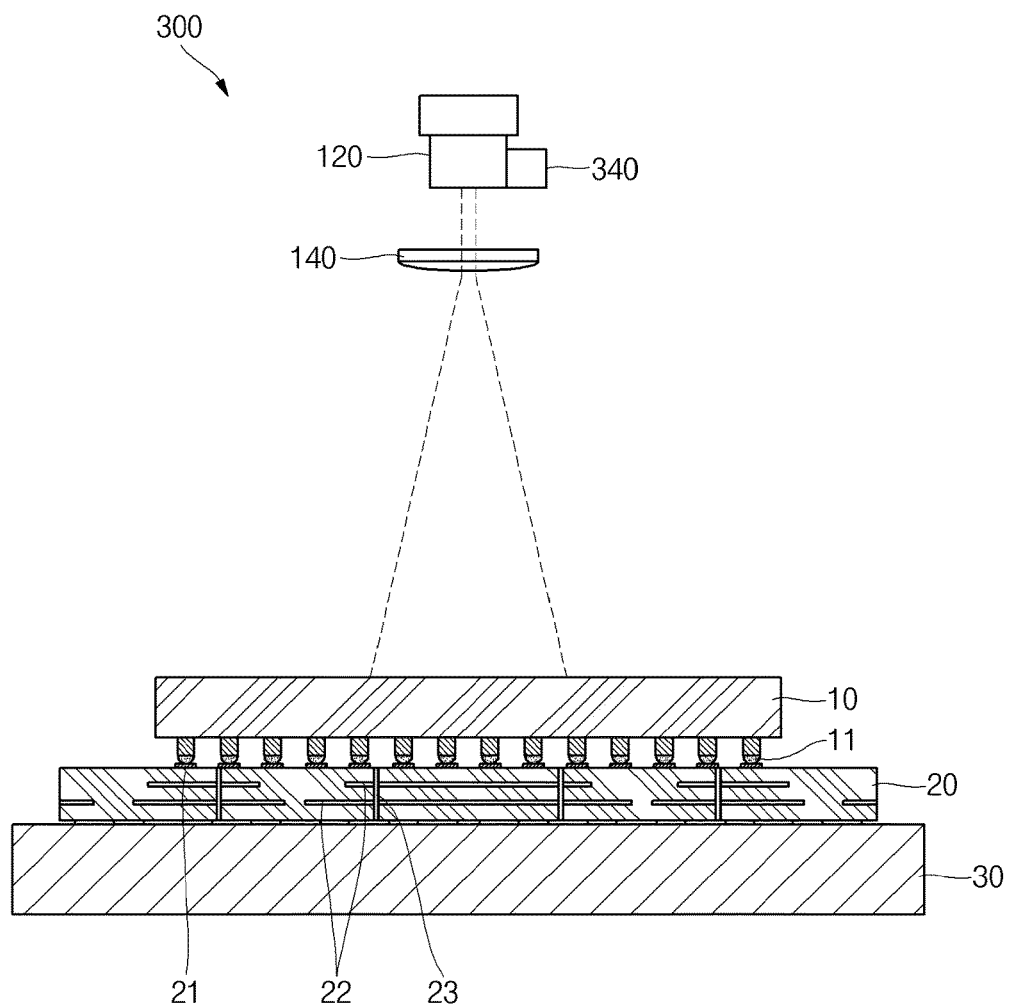
FIGS. 5A and 5B show schematic views illustrating a change in spot size, in accordance with various aspects of the present disclosure.
Figure 5B:
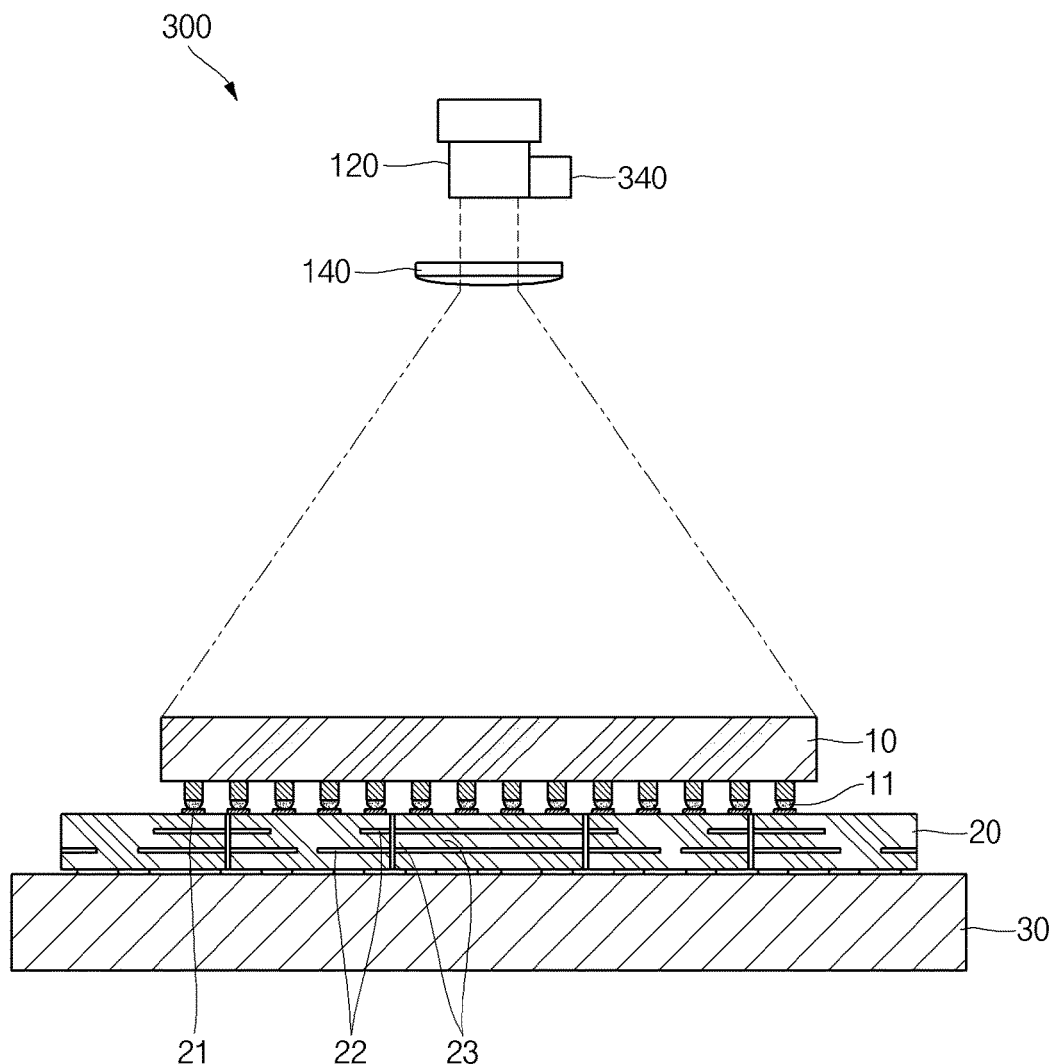

FIGS. 5A and 5B show schematic views illustrating a change in spot size, in accordance with various aspects of the present disclosure. The example laser assisted bonding system 300 or any example system provided herein may, for example, implement the illustrated change in spot size.

Figure 6:
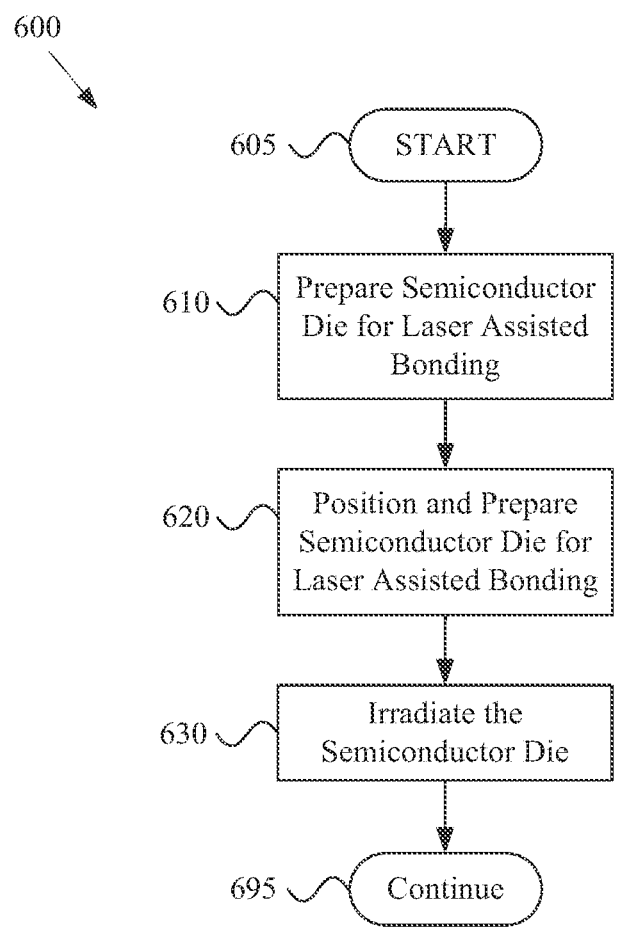
FIG. 6 shows a flow diagram of an example laser assisted bonding method, in accordance with various aspects of the present disclosure.
Figure 7A:
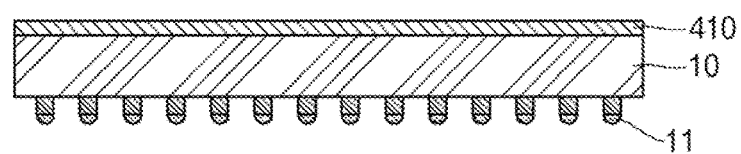
FIGS. 7A-7C show cross-sectional views illustrating example methods and systems for laser assisted bonding, and a semiconductor device produced thereby, in accordance with various aspects of the present disclosure.
Figure 7B:
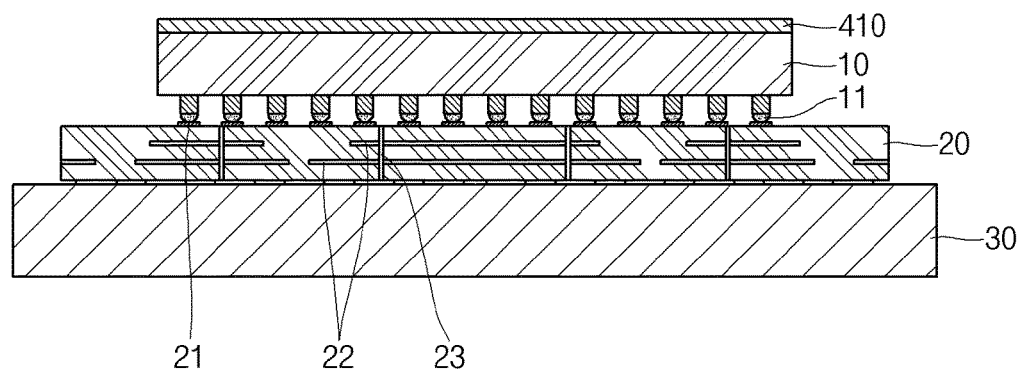
Figure 7C:
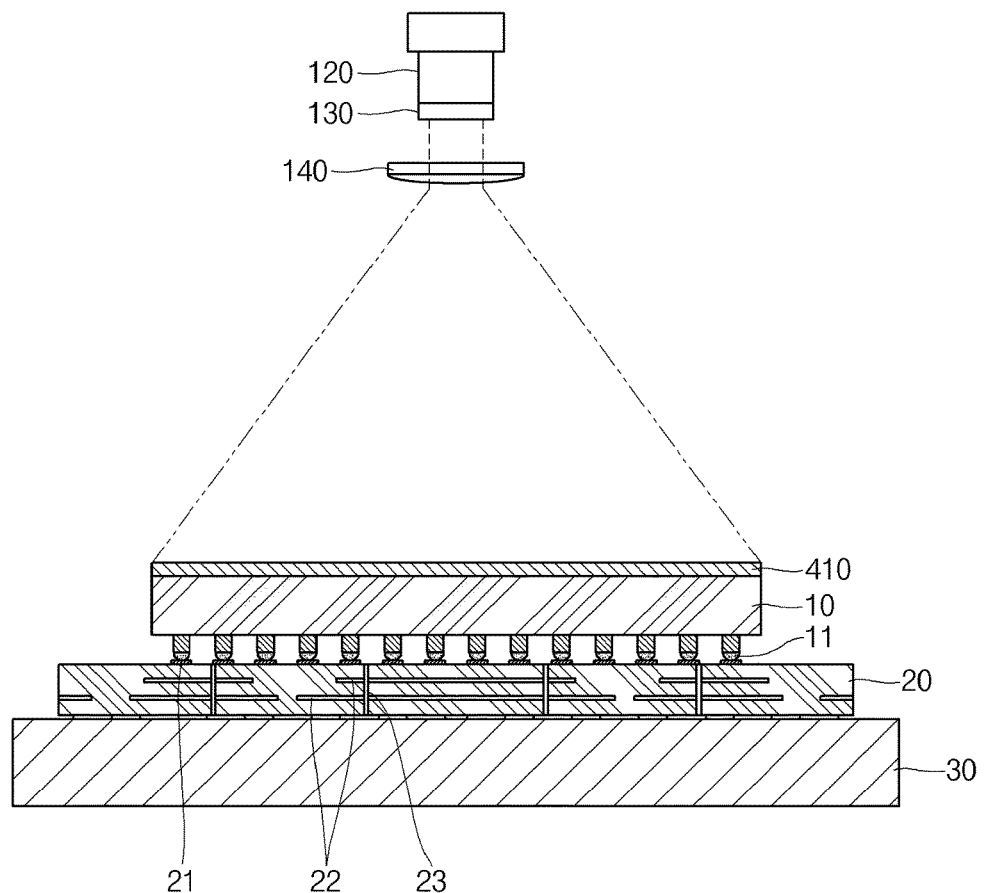

As shown in FIG. 5A, for example during an early stage of a bonding process, the spot size may be adjusted so that only the central region of the semiconductor die 10 is irradiated. For example, the spot size shown in FIG. 5A may correspond to the initial spot size in the graph of FIG. 4 prior to increasing the spot size. As shown in FIG. 5B, for example during a middle stage of a bonding process, the spot size may be adjusted so that the entire top side of the semiconductor die is irradiated. For example, the spot size shown in FIG. 5B may correspond to the second region in FIG. 4 at which such spot size is maintained in a steady state. Additionally, as provided in various examples herein, during a late stage of the bonding process, the spot size may be adjusted so that, again, only the central region of the semiconductor die 10 is irradiated. For example, the spot size shown in FIG. 5A may also correspond to a final spot size in the graph of FIG. 4, after decreasing the spot size from the steady state spot size. In such an example scenario, the temperature of the semiconductor die 10 is gradually increased by the beam homogenizer 120 and the spot size changer 340 during an initial time period, and the temperature of the semiconductor die 10 is gradually decreased by the beam homogenizer 120 and the spot size changer 340 during a final time period, so that the effects of thermal shock on the semiconductor die 10 and/or the interconnection structures 11 may be reduced In various laser assisted bonding scenarios, the surface of the semiconductor die being irradiated by the laser, for example as provided by the fab, might not have physical characteristics that are conducive to receiving and/or absorbing the laser energy. For example, the surface of the semiconductor die might be at least partially reflective, if not highly reflective, and thus reflect a substantial portion of the laser energy radiated onto the surface, rather than efficiently utilizing the energy for bonding. Accordingly, various aspects of the present disclosure provide structures and methods to enhance the efficiency with which laser energy is utilized for die bonding. FIG. 6 shows a flow diagram of an example laser assisted bonding method 600, in accordance with various aspects of the present disclosure. The example method 600 may, for example, share any or all characteristics with any other method discussed herein. FIGS. 7A-7C show cross-sectional views illustrating example methods and systems for laser assisted bonding, and a semiconductor device produced thereby, in accordance with various aspects of the present disclosure. The structures shown in FIGS. 7A-7C may share any or all characteristics with analogous structures shown in FIGS. 1-5. FIGS. 7A-7C may, for example, illustrate an example semiconductor package at various stages (or blocks) of the example method 600 of FIG. 6. FIGS. 6 and 7A-7C will now be discussed together. It should be noted that the order of the example blocks of the example method 600 may vary without departing from the scope of this disclosure.

The example method 600 may, at block 610, comprise preparing a semiconductor die for laser assisted bonding. Block 610 may comprise preparing the semiconductor die in any of a variety of manners, non-limiting examples of which are provided herein.

The semiconductor die may, for example, share any or all characteristics with any other semiconductor die discussed herein (e.g., the semiconductor die 10, etc.). The semiconductor die 10 may, for example, comprise a functional die (e.g., a processor die, memory die, programmable logic die, application specific integrated circuit die, general logic die, etc.). Also for example, the semiconductor die 10 may comprise a semiconductor die comprising only signal routing structures (e.g., one or more dielectric layers and one or more conductive layers for distribution or redistributing electrical signals). Note that although this disclosure generally presents item 10 as a semiconductor die, the scope of this disclosure is not limited thereto. For example, item 10 may comprise any of a variety of other structures (e.g., a semiconductor layer, a dielectric layer, a glass layer, a laminate layer, a molding material layer, an interposer layer, a printed circuit board layer, any combination thereof, etc.) without departing from the scope of this disclosure.

Block 610 may, for example, comprise dicing the semiconductor die from a wafer of such die. Block 610 may also, for example, comprise forming interconnection structures on the semiconductor die (e.g., solder balls or bumps, solder-capped metal posts or pillars, etc.), for example on a bottom side or surface thereof.

Block 610 may additionally, for example, comprise forming a laser beam absorbing layer on the semiconductor die, for example on a top side or surface thereof. The laser beam absorbing layer may, for example, reduce the reflectiveness of the surface irradiated by the laser (e.g., at block 630), thus increasing the absorption of laser energy and the efficiency of the laser energy transfer to the die.

The laser beam absorbing layer (e.g., a high-efficiency energy absorption layer) may comprise any of a variety of characteristics. For example, the laser beam absorbing material may comprise one or more layers of any of a variety of materials (e.g., black or dark carbon, black or dark silicone, black or dark epoxy, black or dark enamel, black or dark polymer, equivalents thereof, mixtures thereof, etc.). However, the scope of the present disclosure is not limited thereto. In an example implementation, the laser beam absorbing layer is about 50 μm. In another example implementation, the laser beam absorbing layer is between 30 μm and 50 μm thick. However, the scope of the present disclosure is not limited thereto.

The laser beam absorbing layer may, for example, be a temporary layer or a permanent layer. In an implementation in which the laser beam absorbing layer is a temporary layer (e.g., utilized during the laser assisted bonding process and then removed, etc.), the laser beam absorbing layer may be soluble such that it can be easily removed from the semiconductor die after laser assisted bonding is completed. Also for example, the laser beam absorbing layer may be made of a material that is readily removed by chemical means (e.g., dissolvable, etchable, etc.) and/or mechanical means (e.g., peelable, thermally releasable, etc.).

Block 610 may comprise forming the laser beam absorbing layer in any of a variety of manners, non-limiting examples of which are provided herein. For example, block 610 may comprise forming the laser beam absorbing layer on an individual die (e.g., after dicing). Also for example, block 610 may comprise forming the laser beam absorbing layer on a wafer of die (e.g., prior to dicing). In an example implementation in which block 610 comprises forming the laser beam absorbing layer on a wafer of die prior to dicing, the laser beam absorbing layer may comprise lateral side surfaces that are coplanar with lateral side surfaces of the semiconductor die.

Block 610 may, for example, comprise forming the laser beam absorbing layer in any of a variety of manners, non-limiting examples of which are provided herein. For example, block 610 may comprise forming the laser beam absorbing layer by spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LP-CVD), plasma enhanced chemical vapor deposition (PECVD), plasma vapor deposition (PVD), sheet lamination, etc.), but the scope of the present disclosure is not limited thereto.

It should be noted that in various example implementations, the laser beam absorbing layer might not be formed. Also for example, the laser beam absorbing layer may be formed on only a portion of the semiconductor die, for example a central region in need of more laser energy than a peripheral region. For example, the laser beam absorbing layer may be formed in a pattern of the same shapes as discussed herein with regard to the beam filtering patterns (e.g., as a negative image thereof, etc.).

FIG. 7A provides an example illustration of various aspects of block 610, for example the die-preparing aspects. The example semiconductor die 10 is shown with an interconnection structure 11 (or a plurality thereof) on the bottom side of the die, and with the laser beam absorbing layer 410 on the top side of the die 10.

The example method 600 may, at block 620, comprise positioning and preparing the semiconductor die for laser assisted bonding. For example, block 620 may comprise positioning (or placing) the semiconductor die on a substrate or other layer to which the semiconductor die is to be bonded.

Each of the interconnection structures of the die may, for example, be aligned with a respective conductive pad of the substrate. In addition, a solder paste and/or a flux may be further printed on the conductive pad and/or interconnection structure. Note that the interconnection structures and conductive pads may, for example, be reversed. For example, the interconnection structures may be on the substrate, and the pads (or other interconnection structure) may be on the semiconductor die 1.

FIG. 7B provides an example illustration of various aspects of block 620, for example the die-positioning and die-preparing aspects. The example semiconductor die 10 is shown with an interconnection structure 11 (or a plurality thereof) on the bottom side of the die 10, and with the laser beam absorbing layer 410 on the top side of the die 10. The substrate 20 may comprise any of a variety of characteristics. For example, the substrate 20 may comprise an interposer, a wafer of interposer dies, a circuit board, a panel of circuit boards, another semiconductor die or wafer thereof, a packaged semiconductor device or portion thereof, etc.).

The substrate 20 may, for example, be fixed on a carrier or general workpiece holder (e.g., secured to a vacuum chuck 30, chipped or adhered to a plate, etc.).

The example method 600 may, at block 630, comprise irradiating the semiconductor die with a laser beam. Block 630 may comprise irradiating the semiconductor die in any of a variety of manners, non-limiting examples of which are provided herein.

For example, block 630 may comprise irradiating the semiconductor die in any one or more of the example manners provided herein, for example utilizing one or more laser assisted bonding systems comprising characteristics of any or all of the example laser assisted bonding systems provided herein (e.g., the example system 100, example system 200, example system 300, etc.). For example, block 630 may comprise irradiating different regions of the semiconductor die with different respective laser beams (or beamlets or laser beam portions) having different respective intensities (e.g., as discussed herein with regard to FIGS. 1-2, etc.). Also for example, block 630 may comprise irradiating the semiconductor die with one or more time-varying spot sizes (e.g., as discussed herein with regard to FIGS. 3-5, etc.). Additionally for example, block 630 may comprise irradiating a laser beam absorbing layer placed on the semiconductor die.

FIG. 7C provides an example illustration of various aspects of block 630, for example laser irradiating aspects. The example semiconductor die 10, or more particularly, a laser beam absorbing layer 410 positioned thereon is shown being irradiated with one or more laser beams.

As the laser beam absorbing layer 410 is irradiated by laser energy, the semiconductor die 10 is also heated, and thus the interconnection structures 11 are also heated. Additionally, solder of the interconnection structures 11 (and/or of the pads 21, between the interconnection structures 11 and the pads 21, etc.) is heated and reflowed. Upon cooling, the reflowed solder solidifies and forms stable electrical and mechanical bonds between the semiconductor die 10 and the substrate 20 (e.g., between the interconnection structures 11 and the pads 21).

At this point, the laser beam absorbing layer 410 (if present) may be removed. Note that the laser beam absorbing layer 410 may, in various example implementations, permanently remain as part of the device. In a scenario in which the laser beam absorbing layer 410 is removed, such material may be removed in any of a variety of manners (e.g., washing with deionized water, chemical removal or etching, mechanical peeling or grinding, etc.).

The example method 600 continues execution at block 695. Such continued execution may comprise any of a variety of characteristics. For example, block 695 may comprise underfilling between the die 10 and the substrate 20 (e.g., utilizing capillary underfill, molded underfill, etc.). Also for example, block 695 may comprise performing a molding or encapsulating process, if utilized. In such an example, an encapsulating layer of molding compound may surround lateral side surfaces of any or all of the semiconductor die 10, of the laser beam absorbing layer 410 if not removed, of the substrate 20, etc. Also for example, an encapsulating layer of molding compound may cover a top side of the semiconductor die 10, including the laser beam absorbing layer 410 if not removed. Block 695 may also, for example, comprise forming interconnection structures (e.g., conductive balls or bumps, conductive posts or pillars, etc.) on the bottom side of the substrate 20. Block 695 may further, for example, comprise directing execution flow of the example method 600 back to any previous block or portion thereof.

In summary, various aspects of this disclosure provide a system and method for laser assisted bonding of semiconductor die. As non-limiting examples, various aspects of this disclosure provide systems and methods that enhance or control laser irradiation of a semiconductor die, for example spatially and/or temporally, to improve bonding of the semiconductor die to a substrate. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing an electronic device, the method comprising:
   positioning an electronic component on a substrate; and
   transmitting laser radiation through at least a beam filter, wherein laser radiation output from the at least the beam filter simultaneously:
      irradiates a first region of the electronic component with a first flat-top laser beam at a first intensity level; and
      irradiates a second region of the electronic component with a second flat-top laser beam at a second intensity level different from the first intensity level.

2. The method of claim 1, wherein the beam filter comprises:
   a base material; and
   a filtering pattern coated on a surface of the base material.

3. The method of claim 1, wherein the beam filter comprises:
a first filtering pattern region that is characterized by a first transmittance level and controls irradiation of the first region of the electronic component; and
a second filtering pattern region that is characterized by a second transmittance level, different from the first transmittance level, and controls irradiation of the second region of the electronic component.

4. The method of claim 1, wherein:
the first region of the electronic component has a first wiring density;
the second region of the electronic component has a second wiring density less than the first wiring density; and
the first intensity level is greater than the second intensity level.

5. The method of claim 1, wherein:
the first region of the electronic component corresponds to a first heat path density;
the second region of the electronic component corresponds to a second heat path density less than the first heat path density; and
the first intensity level is greater than the second intensity level.

6. The method of claim 1, wherein:
the first region of the electronic component comprises a central region of the electronic component; and
the second region of the electronic component comprises a peripheral region of the electronic component.

7. The method of claim 1, comprising prior to said transmitting, forming a laser beam absorbing layer on the electronic component.

8. The method of claim 1, wherein the electronic component comprises a semiconductor die.

9. A method of manufacturing an electronic device, the method comprising:
forming an assembly by, at least in part, positioning an electronic component on a substrate of a plurality of coupled substrates; and
transmitting laser radiation through at least one beam filter to bond the electronic component and the substrate,
wherein the beam filter comprises:
a first filter region having a first level of transmittance and corresponding to a first region of the assembly; and
a second filter region having a second level of transmittance, different from the first level of transmittance, and corresponding to a second region of the assembly.

10. The method of claim 9, wherein in a top view of the beam filter, the second filter region has a cross-like shape.

11. The method of claim 10, wherein:
the beam filter comprises a third filter region having a third level of transmittance that is the same as the first level of transmittance;
the beam filter comprises a fourth filter region having a fourth level of transmittance that is the same as the first level of transmittance;
the beam filter comprises a fifth filter region having a firth level of transmittance that is the same as the first level of transmittance; and
the second filter region separates the first, third, fourth, and fifth filter regions from each other.

12. The method of claim 9, wherein the second filter region is opaque.

13. The method of claim 9, wherein the beam filter allows the electronic component to be irradiated but inhibits the plurality of coupled substrates from being irradiated.

14. The method of claim 9, wherein:
the at least one beam filter comprises a plurality of same beam filters; and
said transmitting laser radiation comprises simultaneously transmitting laser radiation through the plurality of same beam filters.

15. The method of claim 14, wherein the second filter region entirely surrounds the first filter region.

16. The method of claim 9, wherein the beam filter allows the electronic component to be irradiated but inhibits a perimeter of the substrate not covered by the electronic component from being irradiated.

17. The method of claim 9, wherein:
the beam filter comprises a third filter region having a third level of transmittance that is the same as the first level of transmittance, and having a same shape as the first filter region;
the second filter region entirely surrounds the first and third filter regions; and
the second filter region separates the first and third filter regions from each other.

18. A method of manufacturing an electronic device, the method comprising:
positioning an electronic component on a substrate;
selecting a beam filter from a plurality of selectable beam filters;
generating a signal to automatically position the selected beam filter between a laser and the electronic component; and
transmitting laser radiation through at least the selected beam filter to couple the electronic component to the substrate.

19. The method of claim 18, wherein laser radiation output from at least the selected beam filter simultaneously:
irradiates a first region of the electronic component with a first flat-top laser beam at a first intensity level; and
irradiates a second region of the electronic component with a second flat-top laser beam at a second intensity level different from the first intensity level.

20. The method of claim 18, wherein said selecting the beam filter comprises selecting the beam filter based, at least in part, on a type of the electronic component.

21. The method claim 20, wherein the electronic component comprises a semiconductor die, and said selecting the beam filter comprises:
if the electronic component comprises a first type of semiconductor die, then selecting a first beam filter of the plurality of selectable beam filters; and
if the electronic component comprises a second type of semiconductor die, then selecting a second beam filter of the plurality selectable beam filters,
wherein the first beam filter and the second beam filter comprise different respective filtering patterns.

22. The method of claim 18, wherein the plurality of selectable beam filters comprises a plurality of beam filters having a same filtering pattern.

23. The method of claim 18, comprising:
receiving the generated signal at a beam filter changer; and
in response to the received signal, operating the beam filter changer to automatically position the selected beam filter between the laser and the electronic component.

* * * * *